United States Patent
Ke et al.

(10) Patent No.: US 10,862,036 B2
(45) Date of Patent: Dec. 8, 2020

(54) METHOD FOR HIGH RESOLUTION PATTERNING OF ORGANIC LAYERS

(71) Applicants: IMEC VZW, Leuven (BE); FUJIFILM CORPORATION, Tokyo (JP)

(72) Inventors: Tung Huei Ke, Leuven (BE); Pawel Malinowski, Huldenberg (BE); Atsushi Nakamura, Zaventem (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/740,265

(22) PCT Filed: Jun. 27, 2016

(86) PCT No.: PCT/EP2016/064898
§ 371 (c)(1),
(2) Date: Dec. 27, 2017

(87) PCT Pub. No.: WO2017/001353
PCT Pub. Date: Jan. 5, 2017

(65) Prior Publication Data
US 2018/0190908 A1   Jul. 5, 2018

(30) Foreign Application Priority Data
Jun. 29, 2015   (EP) ..................... 15174309

(51) Int. Cl.
*H01L 51/00* (2006.01)
*H01L 51/05* (2006.01)
(Continued)

(52) U.S. Cl.
CPC ...... *H01L 51/0018* (2013.01); *H01L 51/0508* (2013.01); *H01L 51/42* (2013.01);
(Continued)

(58) Field of Classification Search
CPC ................................. H01L 51/0018
(Continued)

(56) References Cited

U.S. PATENT DOCUMENTS

2006/0279204 A1* 12/2006 Forrest ............... H01L 51/5016
   313/506
2010/0155760 A1*  6/2010 Lee ..................... H01L 51/0012
   257/98
(Continued)

FOREIGN PATENT DOCUMENTS

WO   2015/028407 A1   3/2015

OTHER PUBLICATIONS

PCT International Search Report and Written Opinion, PCT International Application No. PCT/EP2016/064898, dated Sep. 7, 2016, 14 pages.
(Continued)

*Primary Examiner* — Thao X Le
*Assistant Examiner* — Eric W Jones
(74) *Attorney, Agent, or Firm* — McDonnell Boehnen Hulbert & Berghoff LLP

(57) ABSTRACT

At least one embodiment relates to a method for photolithographic patterning of an organic layer on a substrate. The method includes providing a water-soluble shielding layer over the organic layer. In addition, the method includes providing a photoresist layer on the water-soluble shielding layer. The method also includes photolithographic patterning of the photoresist layer to form a patterned photoresist layer. Further, the method includes etching the water-soluble shielding layer and the organic layer, using the patterned photoresist layer as a mask, to form a patterned water-soluble shielding layer and a patterned organic layer. Still further, the method includes removing the patterned water-soluble shielding layer. The method includes, before providing the water-soluble shielding layer, providing a hydrophobic protection layer having a hydrophobic upper surface on the organic layer.

13 Claims, 12 Drawing Sheets

(51) Int. Cl.
   *H01L 51/42*   (2006.01)
   *H01L 51/56*   (2006.01)
(52) U.S. Cl.
   CPC .......... *H01L 51/56* (2013.01); *H01L 51/0085* (2013.01); *Y02E 10/549* (2013.01)
(58) Field of Classification Search
   USPC ........................... 257/40, 59, 79, 98; 438/99
   See application file for complete search history.

(56) References Cited

U.S. PATENT DOCUMENTS

| | | | |
|---|---|---|---|
| 2012/0126219 A1* | 5/2012 | Sato | H01L 51/5016 |
| | | | 257/40 |
| 2012/0280216 A1 | 11/2012 | Sirringhaus et al. | |
| 2013/0082244 A1* | 4/2013 | Heller | H01L 51/5268 |
| | | | 257/40 |
| 2013/0084667 A1* | 4/2013 | Otsuka | H01L 51/56 |
| | | | 438/46 |
| 2014/0004642 A1* | 1/2014 | Otsuka | H01L 51/52 |
| | | | 438/46 |
| 2015/0192835 A1* | 7/2015 | Kim | G09G 3/3208 |
| | | | 345/589 |
| 2016/0079323 A1* | 3/2016 | Choi | H01L 27/3246 |
| | | | 257/40 |

OTHER PUBLICATIONS

Takamatsu, Seiichi et al., "Micro-Patterning of a Conductive Polymer and an Insulation Polymer Using the Parylene Lift-Off Method for Electrochromic Displays", Journal of Micromechanics and Microengineering, vol. 21, No. 7, Jun. 21, 2011, pp. 1-6.

* cited by examiner

METHOD FOR HIGH RESOLUTION PATTERNING OF ORGANIC LAYERS

CROSS-REFERENCE TO RELATED APPLICATION

The present application is a national stage entry of PCT/EP2016/064898 filed Jun. 27, 2016, which claims priority to EP 15174309.3 filed on Jun. 29, 2015, the contents of each of which are hereby incorporated by reference.

FIELD OF THE DISCLOSURE

The present disclosure relates to the field of organic electronics. More specifically, it relates to methods for high-resolution patterning of organic layers, such as organic semiconductor layers, using photolithography, and to methods for fabricating organic electronic devices comprising an organic semiconductor layer patterned by photolithography.

Background

Organic electronics research is steadily growing, with developments in materials, processes and system integration. Applications such as organic photovoltaic cells (OPV), organic photodetectors (OPD), organic thin-film transistors (OTFT) and especially organic light-emitting diodes (OLED) for lighting and displays are leading the way to industrialization.

One of the bottlenecks of known methods for the fabrication of organic electronic devices may be related to the limitations of currently available patterning techniques.

A particularly promising technique to achieve a pattern resolution below 10 micrometer in a reproducible way and on large wafer sizes may be photolithography. However, using a photolithographic process in combination with organic semiconductors is not straightforward, because most of the solvents used within standard photoresists, as well as the solvents used for resist development and/or resist stripping may dissolve the organic layers. A few solutions to this problem have been proposed, such as for example dry lithography using frozen $CO_2$ photoresists, orthogonal processing using fluorinated photoresists, or using a barrier layer to protect the organic semiconductor layer and to avoid direct contact between the organic semiconductor layer and the photolithographic chemicals.

One such approach is for example described in WO 2015/028407A1. A method for photolithographic patterning of an organic layer deposited on a substrate is disclosed, wherein a shielding layer is provided on the organic layer before applying a photoresist layer and before performing the photolithographic patterning steps. The shielding layer is a water-soluble layer that can easily be removed after photolithographic patterning by exposing the shielding layer to water or to a solution comprising water.

However, applying such an approach may involve a risk that water penetrates into the organic layer and causes damage to or degradation of the organic semiconductor layer, such as for example a reduction of the carrier mobility, morphological changes, or interface contamination. For example, in the field of organic light emitting diodes (OLEDs) most organic semiconductor materials used, such as the emission layer and the electron transport layer, are water sensitive. When patterning such layers using photolithography in combination with a water-soluble or water-based shielding layer, water may penetrate into the OLED stack, resulting in degradation of the device, e.g. a reduction of the operational lifetime, a reduction of the emission quantum efficiency, a reduction of power efficiency and/or changes in the color emitted by the OLEDs. For other organic semiconductor devices similar degradation mechanisms may occur, leading for example to a reduction of the efficiency of organic photodetectors or organic photovoltaic cells.

SUMMARY

Embodiments described in the present disclosure provide methods for photolithographic patterning of organic layers such as organic semiconductor layers, wherein the methods overcome the disadvantages of the prior art.

The present disclosure relates to a method for photolithographic patterning of an organic layer on a substrate. The method comprises the steps of, e.g. the sequence of steps of, providing a water-soluble shielding layer over the organic layer, providing a photoresist layer on the shielding layer, photolithographic patterning of the photoresist layer to thereby form a patterned photoresist layer, etching the shielding layer and the organic layer using the patterned photoresist layer as a mask to thereby form a patterned shielding layer and a patterned organic layer, and afterwards removing the patterned shielding layer. Furthermore, the method comprises, before providing the water-soluble shielding layer, providing on the organic layer a hydrophobic protection layer having a hydrophobic upper surface. In the context of the present disclosure, the upper surface of the hydrophobic protection layer refers to the surface facing away from the organic layer on which it is provided.

In some embodiments, providing the water-soluble shielding layer may comprise providing the water-soluble shielding layer in direct contact with the hydrophobic protection layer, i.e. without another layer in between.

In some embodiments, removing the patterned shielding layer may comprise exposing the patterned shielding layer to water or to a solution comprising water.

In some embodiments, the organic layer may be an organic semiconductor layer or may comprise an organic semiconductor layer. The organic layer may be a single layer or a multilayer stack comprising at least two layers. The organic layer or organic layer stack may for example comprise an electroluminescent layer or a photosensitive layer, embodiments not being limited thereto. For example, the organic layer may be a multilayer stack e.g. comprising a hole injection layer, an electron blocking layer, a hole transport layer, an electroluminescent organic layer, an electron transport layer, a hole blocking layer and/or an electron injection layer, embodiments not being limited thereto.

In some embodiments, the hydrophobic protection layer may be a hydrophobic organic layer, e.g. a hydrophobic organic semiconductor layer. Using an organic layer, e.g. an organic semiconductor layer, for forming the hydrophobic protection layer may allow for a process compatibility with a fabrication process of organic devices such as OLEDs, OPDs, OPVs or OTFTs. In some embodiments, the hydrophobic protection layer may be a charge transport layer.

In some embodiments, the hydrophobic protection layer, e.g. the hydrophobic organic semiconductor layer, may be a single layer.

In some embodiments, the hydrophobic protection layer, e.g. the hydrophobic organic semiconductor layer, may be a multilayer stack comprising at least two layers, wherein an upper layer of the multilayer stack has a hydrophobic upper surface.

The hydrophobic protection layer, e.g. the hydrophobic organic semiconductor layer, may be provided in direct contact with the organic layer, i.e. without another layer between the organic layer and the hydrophobic layer. However, embodiments are not limited thereto.

The present disclosure is further related to a method for fabricating an electronic device comprising an organic layer, wherein the method comprises photolithographic patterning the organic layer using a method as described above. Examples of electronic devices that may be fabricated using a method according to embodiments are: organic light emitting diodes, organic photodetectors, organic photovoltaic cells, organic thin film transistors and/or arrays comprising such devices, embodiments not being limited thereto.

In a method for fabricating an electronic device according to some embodiments, the organic layer may be an active organic semiconductor layer of the device, and the hydrophobic protection layer may be a hydrophobic organic semiconductor charge transport layer of the device (electron transport layer or hole transport layer). The hydrophobic protection layer may thus remain in the device. The active organic semiconductor layer may have a first HOMO (Highest Occupied Molecular Orbital) energy level and a first LUMO (Lowest Unoccupied Molecular Orbital) energy level, and the hydrophobic organic semiconductor charge transport layer may have a second HOMO energy level and a second LUMO energy level at a surface in contact with the active organic semiconductor layer, wherein the first and second HOMO energy levels and the first and second LUMO energy levels are selected to enable relatively large carrier injection into the active organic semiconductor layer. In some embodiments, the second HOMO energy level may be selected to be lower than the first HOMO energy level and the second LUMO energy level may be selected to be higher than the first LUMO energy level, thus enabling efficient charge injection, more in particular electron injection or hole injection, into the active organic semiconductor layer.

The hydrophobic organic semiconductor charge transport layer may be a multilayer stack comprising a first charge transport layer in contact with the active organic semiconductor layer and a second charge transport layer at an upper side of the multilayer stack, i.e. at a side facing away from the active organic semiconductor layer, the first charge transport layer having suitable HOMO and LUMO energy levels to enable efficient carrier injection into the active organic semiconductor layer as described above, and the second charge transport layer having a hydrophobic upper surface. The second charge transport layer may be doped. The first charge transport layer may be non-doped or at least an upper portion of the first charge transport layer may be doped. Doping the second charge transport layer and an upper portion of the first charge transport layer may reduce the energy barrier for charge injection at the interface between the first charge transport layer and the second charge transport layer.

The electronic device may for example be an organic light emitting device and the active organic semiconductor layer may be an electroluminescent layer. The electronic device may for example be an array of organic light emitting devices.

The electronic device may for example be an organic photodetecting device or an organic photovoltaic device, and the active organic semiconductor layer may be a photosensitive or light absorbing layer. The electronic device may for example be an array of photodetecting devices or an array of photovoltaic devices.

A method in accordance with some embodiments may be used in a fabrication process of an electronic device comprising a first organic layer at a first location, e.g. at first locations, on a substrate and comprising a second organic layer at a second location, e.g. at second locations, on the substrate, in which the second location, e.g. second locations, is non-overlapping with the first location, e.g. first locations. The first organic layer and the second organic layer may be patterned using a method as described above. The device may further comprise a third (further) organic layer at a third (further) location, e.g. third (further) locations, on the substrate, in which the third (further) location, e.g. third (further) locations, is non-overlapping with the first and second locations. The third (further) organic layer may be patterned using a method as described above.

The electronic device may for example be a multicolor organic light emitting device, wherein the first organic layer comprises a first electroluminescent layer for emitting a first color or first color spectrum and wherein the a second organic layer comprises a second electroluminescent layer for emitting a second color or second color spectrum and wherein the third (further) organic layer comprises a third (further) electroluminescent layer for emitting a third (further) color or color spectrum.

In a method for fabrication of such devices, e.g. multicolor devices, in accordance with some embodiments, a first hydrophobic protection layer may be provided on the first organic layer, a second hydrophobic protection layer may be provided on the second organic layer, and a third (further) hydrophobic protection layer may be provided on the third (further) organic layer. The first, second, third (further) hydrophobic protection layers may have the same composition or they may have a different composition, e.g. comprise a different material, with respect to each other.

In a method in accordance with some embodiments, the water-soluble shielding layer may comprise or contain a water-based polymer material that is not cross-linkable. Using a material that is not cross-linkable may allow for easy and completely removal with water or a water-based solution. In a method according to some embodiments, the shielding layer may comprise any of or any combination of polyvinyl pyrrolidone, polyvinyl alcohol, water-soluble cellulose, polyethylene glycol, polyglycerin or pullullan, embodiments not being limited thereto. The shielding layer may further comprise water and/or an alcohol, e.g. a water-soluble alcohol.

In a method in accordance with some embodiments, providing the shielding layer may comprise providing the shielding layer by solution processing, e.g. by spin coating, followed by soft baking at e.g. about 100° C. Solution-based methods may be cost effective and may not require a vacuum. The shielding layer may for example have a thickness in the range between 300 nm and 1000 nm, embodiments not being limited thereto.

In a method in accordance with some embodiments, removing the shielding layer may comprise coating a water layer or a water-based solution on top of the shielding layer. The water-based solution used for removing the shielding layer may comprise water and may further comprise for example Isopropyl alcohol (IPA) and/or Glycerin, embodiments not being limited thereto.

In a method in accordance with some embodiments, providing the photoresist layer may comprise providing a photoresist layer that is solvent-developable. A solvent-developable photoresist may be compatible with the water-based shielding layer.

In a method in accordance with some embodiments, etching the shielding layer and the organic layer may comprise performing one or more dry etching steps, such as for example reactive ion etching (RIE) steps, for example using an oxygen plasma or any other suitable plasma such as for example an Ar plasma, an $SF_6$ plasma or a $CF_4$ plasma, embodiments not being limited thereto. Etching the shielding layer and the organic layer may also comprise etching the hydrophobic protection layer (which is stacked between the organic layer and the shielding layer), thereby forming a patterned hydrophobic protection layer.

A method in accordance with some embodiments may be used in a process for fabricating organic semiconductor based devices and circuits, such as for example organic photodetectors (OPD), e.g. multicolor OPDs, organic thin-film transistors (OTFT) or organic light-emitting diodes (OLED), e.g. multicolor OLEDs. A method in accordance some with embodiments may for example be used in a fabrication process for OLED displays, e.g. multicolor OLED displays, allowing obtaining higher resolutions than with the currently used shadow masking technology. For example, a method in accordance with some embodiments may also be used for patterning of micron sized or sub-micron sized pixel arrays of organic CMOS imagers. A method in accordance with some embodiments be used for fabricating organic smart pixels, e.g. comprising at least one OLED sub-pixel element and at least one OPD sub-pixel element, including arrays of such devices.

A method in accordance with some embodiments may be used in fabrication processes for organic electronic devices requiring high resolution, such as for example high definition full color OLED displays (e.g. for application in mobile electronics, television or viewfinder), high definition full color organic photodetectors and photodetector arrays (e.g. for imager applications), or smart pixels or pixel arrays with multiple integrated organic photodetector and organic light emitting diode sub-pixel elements. A method in accordance with some embodiments may for example be used in a fabrication process for high resolution organic ultrasonic emitting arrays (e.g. for ultrasonic image applications).

Methods in accordance with some embodiments may allow for the use of conventional photolithographic products (photoresists, developers) that are already used in the microelectronics industry, which may obviate a need for using expensive products such as fluorinated photoresists.

It is an advantage of a method Methods in accordance with some embodiments may include hydrophobic protection layers that reduce water intake in the underlying organic layers and protect the underlying organic layers during the photolithographic process. This may result in a substantially longer operational lifetime of a patterned organic device such as a patterned OLED as compared to an organic device that is patterned without using a hydrophobic protection layer.

Methods in accordance with some embodiments may be up-scalable and may be compatible with existing semiconductor process lines.

Methods in accordance with some embodiments may have a highest processing temperature used for patterning of the organic layer below 150° C., or even below 110° C. Therefore the method may be used on flexible foil substrates such as for example a polyethylene naphthalate (PEN) foil or a polyethylene terephthalate (PET) foil, thus enabling the fabrication of flexible organic devices and circuits with high resolution.

Methods in accordance with some embodiments may be cost effective and well-controllable.

Methods in accordance with some embodiments may be used for patterning organic layers that degrade when exposed to water. Further, the methods herein may avoid or strongly reduce the risk of such degradation.

Certain objects of various aspects have been described herein above. Of course, it is to be understood that not necessarily all such objects may be achieved in accordance with any particular embodiment disclosed herein. Thus, for example, those skilled in the art will recognize that the invention may be embodied or carried out in a manner that achieves or optimizes one object or group of objects as taught herein without necessarily achieving other objects as may be taught or suggested herein. Further, it is understood that this summary is merely an example and is not intended to limit the scope of the disclosure. The disclosure, both as to organization and method of operation, together with features thereof, may best be understood by reference to the following detailed description when read in conjunction with the accompanying drawings.

Particular aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
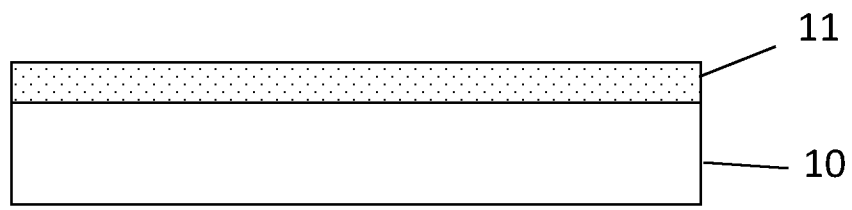
FIG. 1 schematically illustrates a process step of a method for photolithographic patterning of an organic layer on a substrate, according to example embodiments.

Any reference signs in the claims shall not be construed as limiting the scope of the present invention.

In the different drawings, the same reference signs refer to the same or analogous elements.

The drawings are only schematic and are non-limiting. In the drawings, the size of some of the elements may be exaggerated and not drawn on scale for illustrative purposes.

DETAILED DESCRIPTION OF ILLUSTRATIVE EMBODIMENTS

The present disclosure will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of example embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth in order to provide a thorough understanding of the invention and how it may be practiced in particular embodiments. However, it is understood that embodiments may be practiced without these specific details. In other instances, well-known methods, structures and techniques have not been shown in detail in order not to obscure an understanding of this description.

In the context of the present disclosure, hydrophobic means water repellent. A hydrophobic surface is a water repelling surface, characterized by a water contact angle exceeding 90°. The water contact angle is the angle at which a surface of a water droplet provided on a solid surface meets the solid surface. In the context of the present disclosure, a hydrophobic layer is a layer having a hydrophobic surface.

In the context of the present disclosure, a shielding layer or a water-soluble shielding layer is a water-soluble layer that can be removed by exposure to water or to a solution comprising water. The shielding layer may comprise or contain a water-based polymer material that is not cross-linkable. For example, the shielding layer may comprise any of or any combination of polyvinyl pyrrolidone, polyvinyl alcohol, water-soluble cellulose, polyethylene glycol, polyglycerin or pullullan, embodiments not being limited thereto. The shielding layer material may further comprise a solvent comprising water and/or a water-soluble alcohol.

In the context of the present disclosure, a pixel refers to a single image point in an imager or a display. In an imager or a display a plurality of pixels is typically arranged in rows and columns. Each pixel may be composed of sub-pixels, each sub-pixel for example corresponding to a different color. Each sub-pixel comprises a pixel element, for example a light emitting element such as an OLED or a photo-detecting element such as an organic photodetector.

In the context of the present disclosure, a charge transport layer is a layer, e.g. an organic semiconductor layer, having a charge mobility higher than 10' $cm^2/Vs$.

The present disclosure provides a method for photolithographic patterning of an organic layer on a substrate. The method comprises: providing a water-soluble shielding layer over the organic layer, providing a photoresist layer on the shielding layer, photolithographic patterning of the photoresist layer to thereby form a patterned photoresist layer, etching the shielding layer and the organic layer, using the patterned photoresist layer as a mask, to thereby form a patterned shielding layer and a patterned organic layer, and afterwards removing the shielding layer by exposure to water or to a solution comprising water. A method of the present disclosure further comprises, before providing the water-soluble shielding layer, providing on the organic layer a hydrophobic protection layer, e.g. hydrophobic organic semiconductor layer, having a hydrophobic upper surface. As a result of photolithographic patterning according to a method of the present disclosure, a patterned layer stack comprising a patterned organic layer and a patterned hydrophobic protection layer, e.g. hydrophobic organic semiconductor layer, is obtained. The organic layer may be a single layer or a multilayer stack comprising at least two layers. The hydrophobic protection layer may be a single layer or a multilayer stack comprising at least two layers.

FIG. 1 to FIG. 7 schematically illustrate examples of process steps of a method for photolithographic patterning of an organic layer on a substrate, according to embodiments. In a first step, illustrated in FIG. 1, an organic layer 11, e.g. an organic semiconductor layer, is provided on a substrate 10, for example by a solution-based process such as spin coating or by any other suitable method known by a person skilled in the art. The substrate 10 may for example be a glass substrate or any other suitable substrate known to a person skilled in the art, such as for example a flexible foil substrate.

Figure 2:
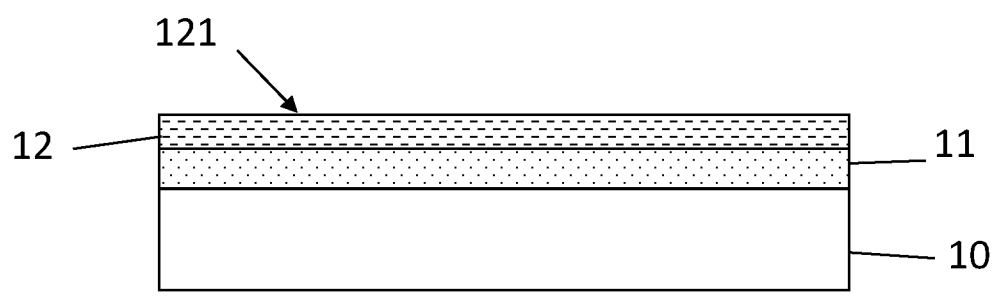
FIG. 2 schematically illustrates a process step of a method for photolithographic patterning of an organic layer on a substrate, according to example embodiments.

Next, a hydrophobic protection layer 12, i.e. a protection layer 12 having a hydrophobic upper surface 121, is provided, e.g. evaporated, on the organic layer 11, as illustrated in FIG. 2. This protection layer 12 is a hydrophobic layer having water repelling properties. For example, the water contact angle on the protection layer may be larger than 90 degrees or larger than 100 degrees. Using a hydrophobic protection layer 12 may reduce water intake into the underlying organic layer 11 during subsequent process steps, such as for example deposition of a shielding layer, photolithography process steps and removal of the shielding layer, as described below. The hydrophobic protection layer 12 may for example have a thickness in the range between 10 nm and 80 nm, e.g. between 15 nm and 50 nm, the present disclosure not being limited thereto.

When fabricating an organic electronic device wherein an organic layer, e.g. an active organic semiconductor layer, is patterned according to embodiments, the hydrophobic protection layer 12 may remain in the device. In such embodiments the hydrophobic protection layer 12 may be a hydrophobic organic semiconductor layer. In an organic electronic device, such as a light emitting device or a light detecting device, the hydrophobic organic semiconductor layer (protection layer 12) may for example have the function of a charge transport layer, i.e. a hole transport layer or an electron transport layer. In such embodiments, the hydrophobic organic semiconductor protection layer 12 may have appropriate HOMO and LUMO energy levels to enable relatively large carrier injection into the active organic semiconductor layer. In such embodiments, the hydrophobic organic semiconductor protection layer 12 may have beneficial charge transport properties, e.g. a charge carrier mobility larger than $10^{-6}$ $cm^2/Vs$, larger than 10' $cm^2/Vs$, larger than $10^{-3}$ $cm^2/Vs$, or larger than 10' $cm^2/Vs$, such that it can function as an electron transport layer or as a hole transport layer in the final organic electronic device.

The hydrophobic protection layer 12 may consist of a single layer or it may be a multilayer stack, i.e. a stack comprising two or more layers. The hydrophobic protection layer 12 may be a doped layer or a non-doped layer or a partially doped layer. In embodiments in which the protection layer is present at a light emitting side of the device, e.g. for a light emitting device such as an OLED, or at a light receiving side of the device, e.g. for a light detecting device such as an OPD or OPV device, the protection layer 12 may have a relatively high good transparency, such as e.g. a transparency higher than 95%, higher than 98%, or at least 99%, at the wavelength or in the range of wavelengths emitted, respectively absorbed, by the device.

Figure 11:
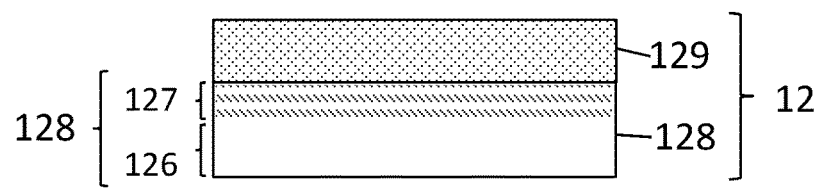
FIG. 11 schematically illustrates an example of hydrophobic protection layer wherein the protection layer is a multi-layer stack, according to example embodiments.

FIG. 11 schematically illustrates an example of hydrophobic protection layer 12 wherein the protection layer is a multi-layer stack. For example, the protection layer 12 may be a stack of a first charge transport layer 128 and a second charge transport layer 129, the second charge transport layer being a hydrophobic layer. The first charge transport layer 128 may have a lower portion 126 that is undoped and an upper portion 127 that is doped, e.g. the upper portion being the portion in contact with the hydrophobic charge transport layer 129. The hydrophobic second charge transport layer 129 may be doped. This is only an example, and embodiments of are not limited thereto.

For example, the hydrophobic protection layer 12 may be a stack comprising a NET18 first electron transport layer 128 and a doped DFH-4T second electron transport layer 129, in which the protection layer 12 may be provided on an organic emission layer (organic layer 11) of an organic light emitting device. The DFH-4T layer can function as an electron transport layer and as a hydrophobic layer. It has beneficial electron transport properties (electron mobility about 0.64 $cm^2/Vs$) and beneficial hydrophobic properties (contact angle with water of 122 degrees). It can repel water and reduce water intake of the layers underneath. The first electron transport layer 128 may be provided for establishing a contact to the emission layer (active organic semiconductor layer 11) of the OLED and may have a good energy level matching with the emission layer to enable efficient charge injection from the first electron transport layer 128 into the emission layer. The LUMO level of (undoped) DFH-4T is too low for electron injection from the DFH-4T layer into an (undoped) NET18 layer. Therefore the DFH-4T layer 129 may be n-doped, for example with a conductive dopant such as for example NDN26, which can reduce the energy barrier at the interface between the NET18 layer 128 and the DFH-4T layer 129. An upper part or upper portion 127 of the first electron transport layer 128 may be n-doped too (e.g. with the same dopant, e.g. NDN26) to further improve electron injection from the DFH-4T layer 129 into the first electron transport layer 128. In this example, the stack of the DFH-4T layer 129 and the (partially doped) first electron transport layer 128 may form the protection layer 12. The thickness of the DFH-4T layer may for example be in the range between 10 nm and 50 nm, embodiments not being limited thereto. This combination of materials can be used in OLEDs of different colors, such as in red, green and blue OLEDs, for example. Other suitable materials may be used for forming the electron transport layer, the hydrophobic protection layer and the dopant.

Some examples of organic materials that may be used as a material for the hydrophobic charge transport layer, more in particular hydrophobic electron transport layer, are: 5,5'-Bis((5-perfluorohexyl)thiophen-2-yl)-2,2'-bithiophene (DFH-4T), Copper(II) 1,2,3,4,8,9,10,11,15,16,17,18,22,23,24,25-hexadecafluoro-29H,31H-phthalocyanine (F16CuPC), and N,N'-Bis(2,2,3,3,4,4,4-heptafluorobutyl)-3,4,9,10-perylene dicarboximide (PTCPI-CH2C3F7), embodiments not being limited thereto.

Some examples of organic materials that may be used as a material for the hydrophobic charge transport layer, more in particular hydrophobic hole transport layer, are: 5,5'-Bis (3-hexyl-2-thienyl)-2,2'-bithiophene (DH-4T), diphenyl-dinaphtho[2,3-b:2',3'-f]thieno[3,2-b]thiophene (DphDNTT), dinaphtho[2,3-b:2',3'-f]thieno[3,2-b]thiophene (DNTT), N2,N7-Di(naphthalen-1-yl)-9,9-dioctyl-N2,N7-diphenyl-9H-fluorene-2,7-diamine (DOFL-NPB), N,N'-Bis(3-methylphenyl)-N,N'-bis(phenyl)-9,9-dioctylfluorene (DOFL-TPD), 2,3,8,9,14,15-Hexafluorodiquinoxalino[2,3-a:2',3'-c] phenazine (HATNA-F6), 2,7-Bis[9,9-di(4-methylphenyl)-fluoren-2-yl]-9,9-di(4-methylphenyl)fluorene (TDAF), N,N'-Dioctyl-3,4,9,10-perylenedicarboximide (PTCDI-C8), and N,N'-Ditridecyl-3,4,9,10-perylenedicarboximide (PTCDI-C13), embodiments not being limited thereto.

A layer of a material listed above may be provided in combination with a charge transport layer to form the protection layer (multilayer stack) 12, for example as illustrated in FIG. 11. Alternatively, a layer of a material listed above may be used as a single protection layer 12 directly on an organic layer, such as an emission layer of an OLED, if it has appropriate energy levels, i.e. allowing efficient charge injection into the emission layer. The listed materials have different energy levels, and may therefore each be suitable for an OLED with a specific color (without the need for combining with another charge transport layer). Different materials may be used for different colors.

Figure 3:
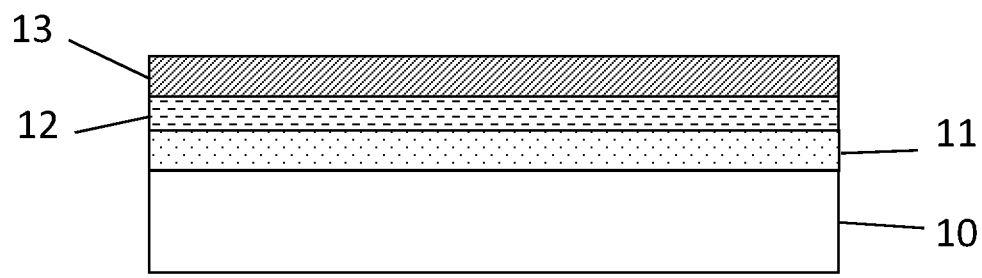
FIG. 3 schematically illustrates a process step of a method for photolithographic patterning of an organic layer on a substrate, according to example embodiments.

After having provided the protection layer 12, a water-soluble shielding layer 13 is provided on the protection layer 12, as illustrated in FIG. 3. The shielding layer 13 comprises a shielding material, the shielding material comprising e.g. a water-based polymer that is not cross-linkable. The shielding layer may further comprise water and/or a water-soluble alcohol.

The shielding layer 13 may be provided by a solution-based process such as for example spin coating, slot die coating or blade coating. Subsequently a soft bake, e.g. a hot plate soft bake, for example at a temperature in the range between 90° C. and 110° C. may be done. However, such soft bake step may be omitted and drying of the shielding layer 13 may be done at ambient temperature. It was surprisingly found that a water containing shielding layer can be spin coated with relative uniformity on the hydrophobic surface of the protection layer 12. As an alternative to solution-based processing, the shielding layer 13 may be provided by evaporation.

Figure 4:
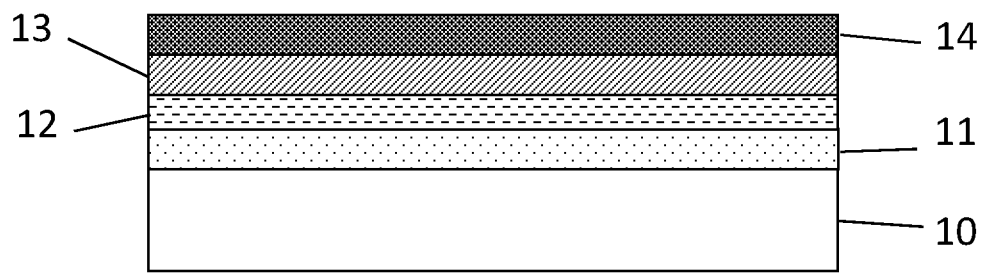
FIG. 4 schematically illustrates a process step of a method for photolithographic patterning of an organic layer on a substrate, according to example embodiments.

Next, a photoresist layer 14 may be spin coated on the shielding layer 13, followed by a soft bake step, such as for example a hot plate soft bake step for 1 minute at 100° C. The photoresist layer 14 comprises a photoresist that may be developed in a solvent based developer. The photoresist may be a negative tone resist. However, embodiments are not limited thereto and the photoresist may be a positive tone resist. A cross section of the resulting structure is shown in FIG. 4.

The photoresist layer 14 may then be exposed to light, e.g. UV light, through a shadow mask and developed. After development of the photoresist, the structure shown in FIG. 5 may be obtained, with a patterned photoresist layer 141.

The shielding layer 13, the protection layer 12 and the organic layer 11 are then etched, thereby using the patterned photoresist layer 141 as a mask. As illustrated in the example shown in FIG. 6, the etching process results in the formation of a patterned shielding layer 131, a patterned protection layer 121 and a patterned organic layer 111. The etching process may for example be a dry etching step or a combination of dry etching steps, such as for example a reactive ion etching step using an oxygen plasma or an argon plasma, embodiments not being limited thereto.

Figure 7:
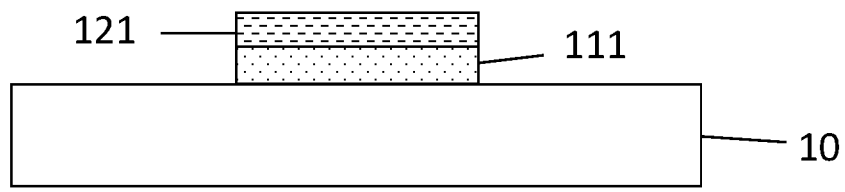
FIG. 7 schematically illustrates a process step of a method for photolithographic patterning of an organic layer on a substrate, according to example embodiments.

Finally, the patterned shielding layer 131 may be removed, e.g. by exposure to water or a water-based solution, for instance a solution of water (90%) and IPA (10%) or a mixture of water (90%), IPA (5%) and Glycerin (5%), for example by spin-coating a water layer or a water-based solution on the device. The patterned photoresist layer 141 may be removed before exposure of the shielding layer to water. Alternatively, the patterned photoresist layer 141 may be removed together with the patterned shielding layer 131 when it is exposed to water. This results in a stack of a photolithographically patterned organic layer 111 and a photolithographically patterned protection layer 121 on the substrate 10, as illustrated in FIG. 7.

Figure 5:
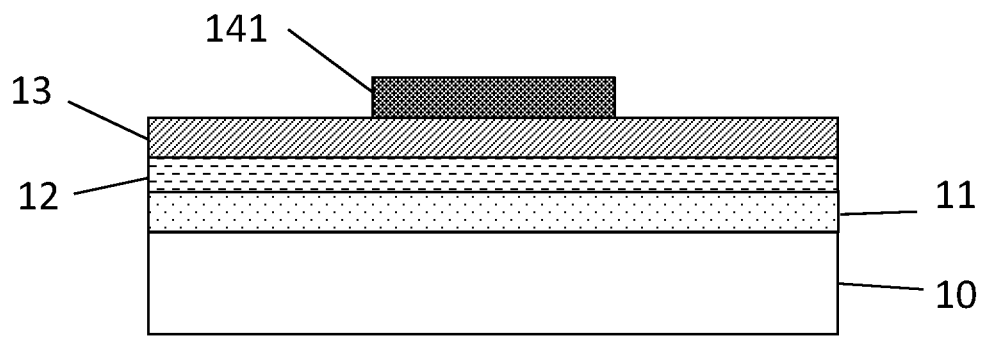
FIG. 5 schematically illustrates a process step of a method for photolithographic patterning of an organic layer on a substrate, according to example embodiments.
Figure 6:
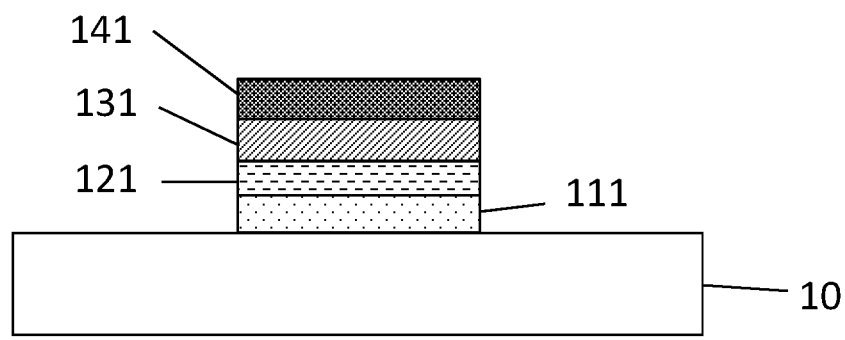
FIG. 6 schematically illustrates a process step of a method for photolithographic patterning of an organic layer on a substrate, according to example embodiments.
Figure 8:
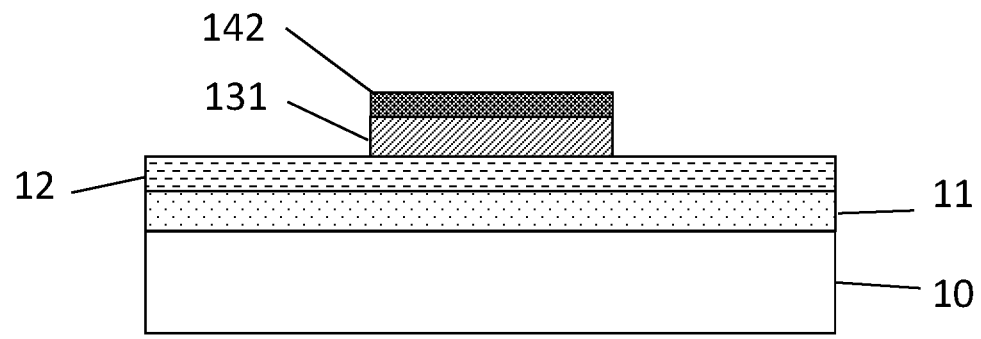
FIG. 8 schematically illustrates an example of an etching step of a method for photolithographic patterning of an organic layer on a substrate, according to example embodiments.
Figure 9:
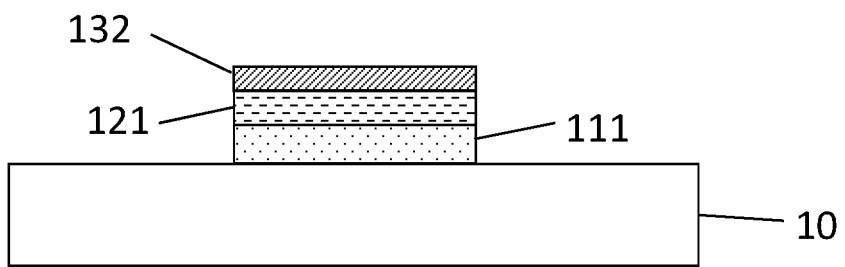
FIG. 9 schematically illustrates an example of an etching step of a method for photolithographic patterning of an organic layer on a substrate, according to example embodiments.
Figure 10:
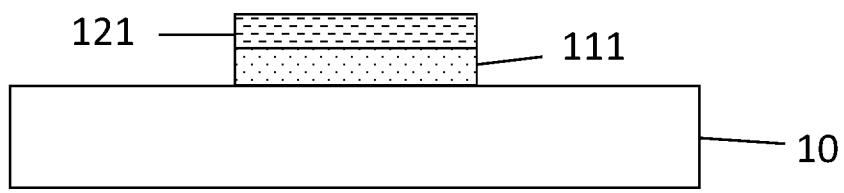
FIG. 10 schematically illustrates an example of an etching step of a method for photolithographic patterning of an organic layer on a substrate, according to example embodiments.

In embodiments, the etching process for patterning the shielding layer 13, the protection layer 12 and the organic layer 11 may be a single etching step or it may comprise a sequence of at least two etching steps. An example of such a process comprising a sequence of etching steps is schematically illustrated in FIG. 8 to FIG. 10. As described above, after photoresist development, a structure as shown in FIG. 5 is obtained. On such structure a first dry etching step may be done, such as for example a reactive ion etching step using an oxygen plasma, thereby removing (at least) an upper portion of the patterned photoresist layer 141 and completely removing the shielding layer 13 at the locations where it is exposed to the plasma (at the exposed locations, i.e. at locations where no photoresist layer 141 is present anymore), resulting in a structure as, for example, shown in FIG. 8. The layer thicknesses (and etch rates) of the photoresist layer 141 and the shielding layer 13 may be selected such that after this first dry etching step, at least a layer of shielding material remains. The remaining layer of shielding material can, for instance, have a thickness of at least 200 nm or at least 300 nm, but embodiments are not limited thereto. The remaining shielding material layer acquires the pattern of the patterned photoresist layer 141. In the example shown in FIG. 8, the resulting structure comprises a patterned shielding layer 131 and a thinned patterned photoresist layer 142. However, in other embodiments, the photoresist layer may be fully removed by the first etching step. In other embodiments, in addition an upper portion of the shielding layer may be removed by the first dry etching step.

After complete removal of the shielding layer 12 at the exposed locations (i.e. at locations where no photoresist layer 141 was present anymore), a second dry etching step may be done. In some embodiments, the second dry etching step may be a continuation of the first dry etching step. The second dry etching step may for example comprise reactive ion etching using an oxygen plasma. The second dry etching step thus may result in a complete removal of the protection layer 12 and the organic layer 11 at the exposed locations (i.e. at the locations where no shielding layer is present any more). Simultaneously, the thinned photoresist layer 142 (if present) may be completely removed, as well as an upper portion of the patterned shielding layer 131, resulting in a thinned shielding layer 132. By properly selecting the thickness of the shielding layer in view of the thickness of the protection layer 12 and of the organic material layer 11 (and taking into account the corresponding etch rates), after complete removal of the protection layer 12 and the organic layer 11 at the locations not covered by the patterned shielding layer 131, there may still remain a thinned layer 132 of the shielding material. This is schematically illustrated in FIG. 9.

Finally, the remaining shielding material layer 132 may be removed in water or a water-based solution, for instance a solution of water (90%) and IPA (10%) or a mixture of water (90%), IPA (5%) and Glycerin (5%), for example by spin-coating a water layer or a water-based solution on the device. This results in a stack of a photolithographically patterned organic layer 111 and a photolithographically patterned protection layer 121 on the substrate 10, as illustrated in FIG. 10.

Figure 12:
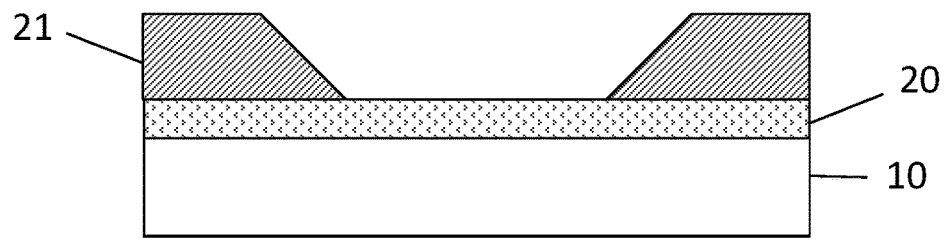
FIG. 12 schematically illustrates an example of a process step of a method for fabricating an organic light emitting device (OLED), according to example embodiments.

An example of a method for fabricating an OLED, in which the active organic semiconductor layer (electroluminescent layer) is patterned according to embodiments, is schematically illustrated in FIG. 12 to FIG. 18. This is only an example, and embodiments are not limited thereto. For example, some of the layers described hereinbelow may be omitted from the device and/or other layers may be included in the device. The method illustrated as an example may comprise the following steps:

Depositing an anode layer 20 on a substrate 10 and forming a patterned edge cover layer 21 on the anode layer 20, the patterned edge cover layer 21 e.g. covering edges of the anode layer 20 (FIG. 12). The edge cover layer may be provided as a protection against shorts and leakage. Such edge cover layer can be made of an organic or inorganic material with electrical insulating properties. The anode layer may for example comprise ITO, Ag, Molybdenum, Al, Au, Cu, CNT or a stack of different materials, embodiments not being limited thereto.

Figure 13:
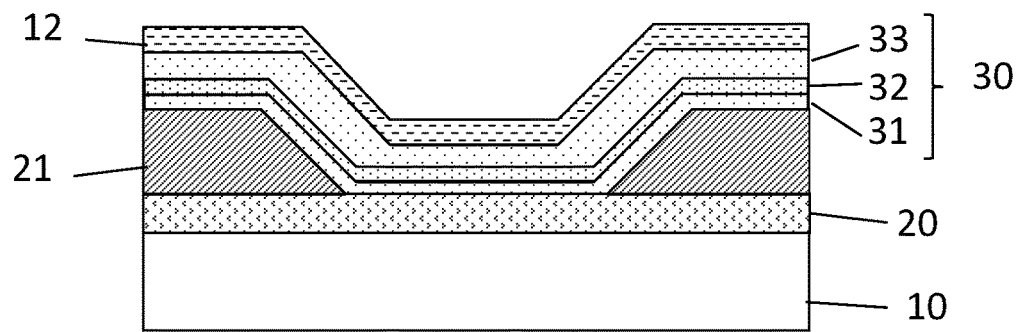
FIG. 13 schematically illustrates an example of a process step of a method for fabricating an OLED, according to example embodiments.

Depositing, e.g. evaporating or spin coating, an organic layer stack 30, wherein the organic layer stack for example comprises a hole injection layer 31, a hole transport layer 32 and a light emission layer (electroluminescent layer) 33. Depositing, e.g. evaporating or spin coating, a hydrophobic organic semiconductor electron transport layer 12 (hydrophobic protection layer 12) on the organic layer stack 30. A cross section of the resulting structure is schematically shown in FIG. 13. The hole injection layer 31 may for example comprise F4-TCNQ, Meo-TPD, HATCN or $MoO_3$, embodiments not being limited thereto. The hole transport layer 32 may for example comprise Meo-TPD, TPD, spiro-TAD, NPD, NPB, TCTA, CBP, TAPC, amine and/or a carbazole based material, embodiments not being limited thereto. The light emission layer 33 may for example comprise a host material such as MCP, TCTA, TATP, CBP or a carbazole based material, embodiments not being limited thereto, and a dopant. Examples of red dopants that may be used are DCJTB, Rubrene, $Ir(btp)_2(acac)$, PtOEP, and $Ir(MDQ)_2acac$. Examples of green dopants that may be used are C545T, $Ir(PPY)_3$, $Ir(PPY)_2acac$ and $Ir(3mppy)_3$. Examples of blue dopants that may be used are BCzVBi, DPAVBi, FlrPic, 4P-NPD and DBZa.

Figure 14:
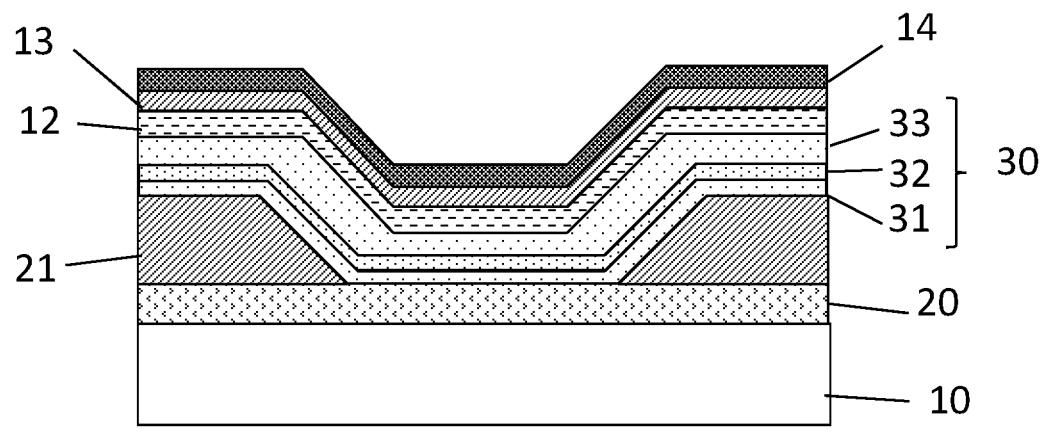
FIG. 14 schematically illustrates an example of a process step of a method for fabricating an OLED, according to example embodiments.

Depositing, e.g. spin coating, a water-soluble shielding layer 13 on the hydrophobic organic semiconductor layer 12 and depositing a photoresist layer 14 on the shielding layer 13 (FIG. 14).

Figure 15:
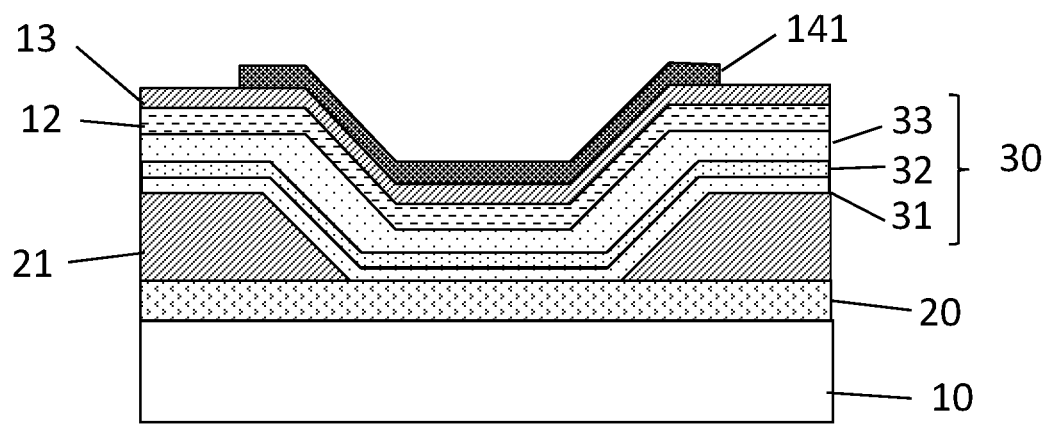
FIG. 15 schematically illustrates an example of a process step of a method for fabricating an OLED, according to example embodiments.

Patterning the photoresist layer, thereby forming a patterned photoresist layer 141 (FIG. 15).

Figure 16:
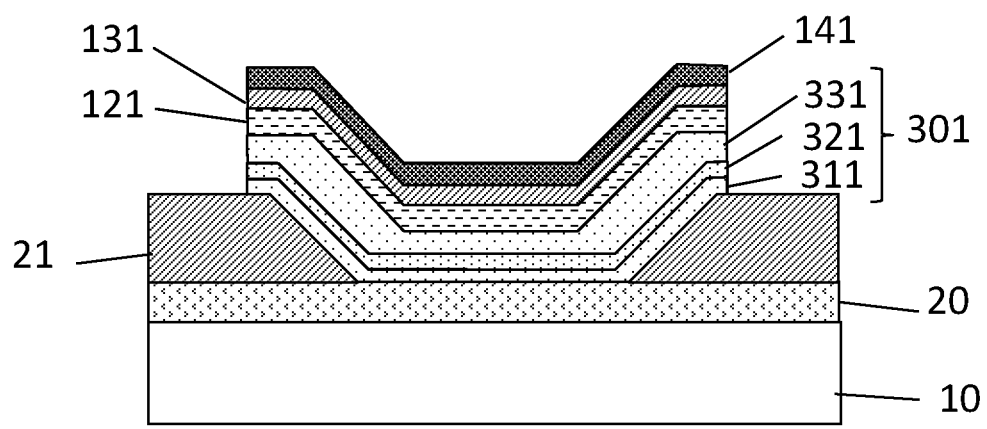
FIG. 16 schematically illustrates an example of a process step of a method for fabricating an OLED, according to example embodiments.

Etching, e.g. plasma etching, the shielding layer 13, the hydrophobic organic semiconductor layer 12 and the organic layer stack 30, using the patterned photoresist layer 141 as a mask (FIG. 16), thereby forming a patterned shielding layer 131, a patterned hydrophobic organic semiconductor layer 121 and a patterned organic layer stack 301, the patterned organic layer stack 301 comprising in the example shown a patterned hole injection layer 311, a patterned hole transport layer 321 and a patterned light emission layer 331 (FIG. 16).

Figure 17:
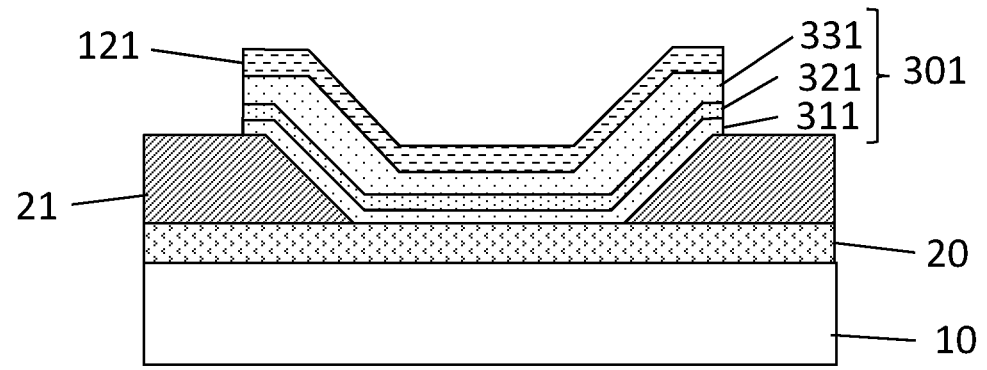
FIG. 17 schematically illustrates an example of a process step of a method for fabricating an OLED, according to example embodiments.

Removing the patterned photoresist layer 141 and removing the patterned shielding layer 131 by exposure to water (FIG. 17). The patterned photoresist layer 141 may be removed before exposing the patterned shielding layer 131 to water. Alternatively, the patterned photoresist layer 141 may be removed simultaneously with the patterned shielding layer 131 by exposure to water.

Depositing, e.g. evaporating or spin coating, an electron transport layer 41 and an electron injection layer 42, and afterwards depositing, e.g. evaporating, a cathode layer 50 on the electron injection layer 42. The cathode layer 50 may for example comprise Ag, Al, Mg or an Ag alloy, embodiments not being limited thereto. A cross section of the resulting patterned OLED structure

Figure 18:
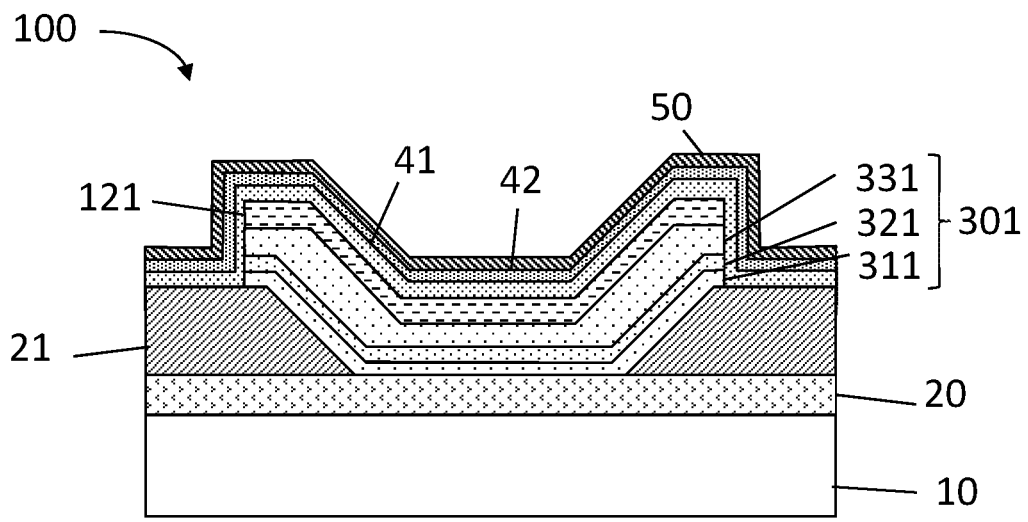
FIG. 18 schematically illustrates an example of a process step of a method for fabricating an OLED, according to example embodiments.

100 is schematically shown in FIG. 18. The electron transport layer 41 may for example comprise Alq3, TPBI, Bphen, NBphen, BCP, BAlq or TAZ, embodiments not being limited thereto. The electron injection layer 42 may for example comprise Lif, $CsCO_3$, CsF, Yb or Liq, the present disclosure not being limited thereto.

Experiments were done wherein the operational lifetime of OLEDs that were patterned using a method according to embodiments was compared to the operational lifetime of OLEDs that were patterned using a water-based shielding layer but without a protection layer. The OLEDs had a 20 nm thick TATP light emission layer doped with $Ir(MDQ)_2$ (5%). For the OLEDs fabricated using a method according to embodiments, a multilayer protection layer 12 was used, more in particular a stack consisting of a 30 nm thick NET18 layer (first electron transport layer 128) and a 15 nm thick DFH-4T hydrophobic layer (second electron transport layer 129) doped with NDN26 (5%). A lower portion 126 of the NET18 layer (i.e. the portion in contact with the emission layer) was undoped and had a thickness of 20 nm and an upper portion 127 of the NET18 layer (i.e. the portion in contact with the doped DFH4T layer) was doped with NDN26 (5%) and had a thickness of 10 nm.

Figure 19:
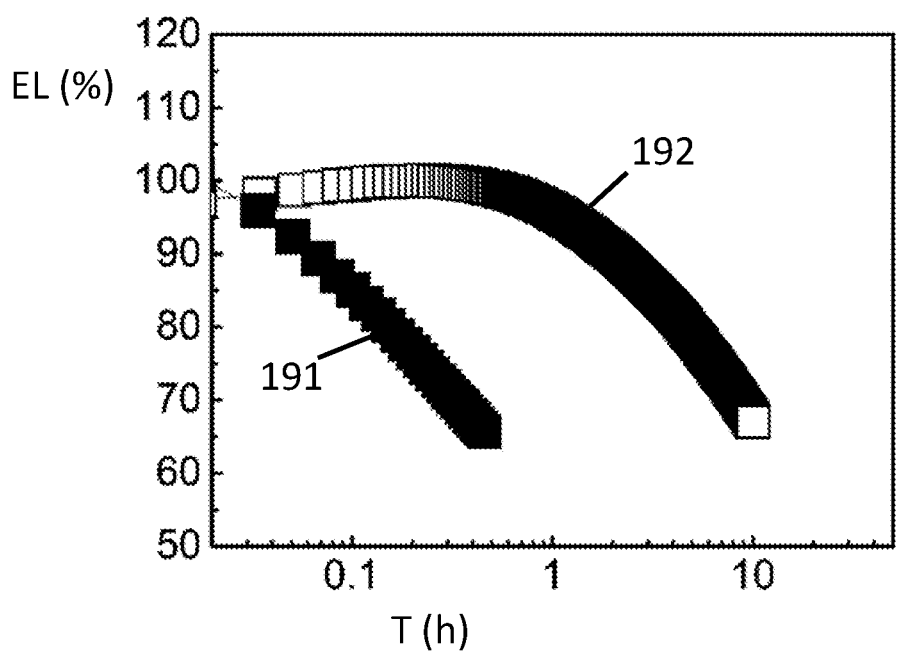
FIG. 19 shows the measured operational lifetime of patterned OLEDs respectively fabricated according to a prior art method and fabricated according to example embodiments.

For measuring the operational lifetime, the OLEDs were driven by a current with a current density up to 50 $mA/cm^2$. The initial light intensity emitted by the OLEDs was recorded and the light degradation was monitored continuously until the emitted light intensity dropped to 50% of the initial light intensity. The operational lifetime corresponds to the time period T50 after which the emitted light intensity is reduced to 50% of the initial light intensity, at a constant bias current (50 $mA/cm^2$ in the example shown). The measured results are shown in FIG. 19. In FIG. 19, the results 192 show the normalized electroluminescence EL, in percentage, as a function of time T, expressed in units of hours, for a patterned OLED fabricated using a method according to embodiments, e.g. a method wherein a hydrophobic protection layer is provided on the organic layer before providing the water-soluble shielding layer. The results 191 show the normalized electroluminescence as a function of time for a patterned OLED fabricated using a prior art method wherein the water-soluble shielding layer is provided directly on the organic layer. It was found that the operational lifetime of the OLEDs patterned according to a method of the present disclosure was 22 hours, whereas it was 1.3 hours for the OLEDs patterned according to a prior art method, e.g. a prior art method without hydrophobic protection layer.

Embodiments may advantageously be used in a method for fabricating a device comprising a first patterned organic device layer at a first location, e.g. at first locations, and a second patterned organic device layer at a second location, e.g. at second locations, on a substrate, e.g. on a single substrate. The first location, e.g. first locations, and the second location, e.g. second locations may be non-overlapping.

An example of a method for fabricating an organic device comprising a first patterned organic layer at a first location, e.g. at first locations, a second patterned organic layer at a second location, e.g. second locations, and a third patterned organic layer at a third location, e.g. third locations, in accordance with embodiments is schematically illustrated in FIG. 20 to FIG. 33.

As an example, process steps for the fabrication of a device, e.g. a three-color OLED device, comprising a first patterned device layer at a first location on a substrate, e.g. for providing a first color (first sub-pixel), and a second patterned device layer at a second location on the substrate, e.g. for providing a second color (second sub-pixel), are shown. This example process further comprises a third patterned device layer, e.g. at a third location on the substrate, e.g. for providing a third color (third sub-pixel). Thus the example process particularly may form part of a manufacture process for fabricating a three-color OLED. The figures show cross sections corresponding to a single OLED pixel comprising three sub-pixels.

However, it shall be understood that an OLED device may comprise a large number of such pixels, each comprising three such sub-pixels, the pixels being for example arranged in a pixel grid or array. A process according to embodiments may thus be used for fabricating a plurality of three-color OLEDs, corresponding to a plurality of pixels, on a single substrate, such as for example an array of three-color OLEDs, e.g. arranged in a plurality of rows and a plurality of columns. More in general, a process according to embodiments may be used for the formation of patterned layer stacks with different properties side by side, e.g. for providing different colors in an OLED or in an OPD or for providing various functionalities in a circuit, and for the fabrication of arrays of such patterned multilayer stacks.

Figure 20:
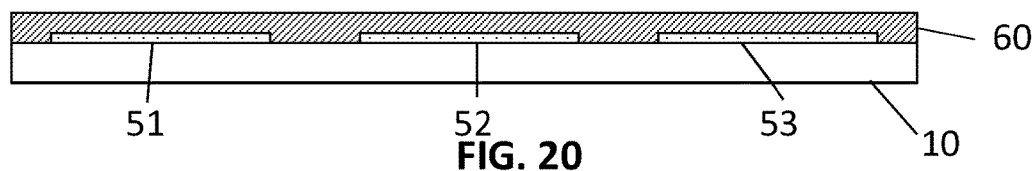
FIG. 20 schematically illustrates an example of a process step of a method for fabricating a three-color OLED, according to example embodiments.

FIG. 20 schematically shows a substrate 10 which may have, e.g. provided on a surface thereof, a first bottom electrode 51, a second bottom electrode 52 and a third bottom electrode 53. The electrodes may for example be formed to provide electrical connections to the device layers to be provided thereon in accordance with embodiments. For example, in the final device, e.g. in the finished OLED device, the first bottom electrode 51 may be a bottom electrode of a first sub-pixel, e.g. corresponding to a first color, the second bottom electrode 52 may be a bottom electrode of a second sub-pixel, e.g. corresponding to a second color, and the third bottom electrode 53 may be a bottom electrode of a third sub-pixel, e.g. corresponding to a third color. At the edges of the bottom electrodes an edge cover layer (not illustrated) may be present to provide protection against shorts and leakage. Such edge cover layer can be made of an organic or inorganic material with electrical insulating properties. The substrate 10 may be a glass substrate or a flexible foil substrate or any other suitable substrate known by the person skilled in the art. The bottom electrodes may for example comprise ITO (Indium Tin Oxide), Mo, Ag, Au, Cu, a conductive polymer such as for example PEDOT:PSS (poly(3,4-ethylenedioxythiophene) poly(styrenesulfonate), or a conductive CNT (carbon nanotube) or graphene layer, embodiments not being limited thereto.

The example method according to embodiments of the present disclosure, illustrated in the drawings, comprises depositing an initial shielding layer 60 on the substrate 10 (FIG. 20). Thus, on the substrate 10 an initial shielding layer 60 is provided, as shown in FIG. 20. The initial shielding layer 60 may be a layer that does not cause degradation of a device layer or device layer stack to be provided further in the process. The initial shielding layer 60 may for example be a water-based material or an alcohol-based material. It may contain a polymer such as for example polyvinyl alcohol, polyvinyl pyrrolidone, water-soluble cellulose, polyethylene glycol, polyglycerin or pullullan. It may further contain a solvent comprising water and/or an alcohol. The alcohol may for example be an alcohol without alkoxy groups, such as for example isopropyl alcohol. The alcohol may for example be a water-soluble alcohol. The solvent may contain only water, only an alcohol, or a mixture of water and a water-soluble alcohol. The thickness of the initial shielding layer 60 may for example be in the range between 100 nm and 6000 nm, e.g. between 500 nm and 2000 nm, embodiments not being limited thereto.

Figure 21:
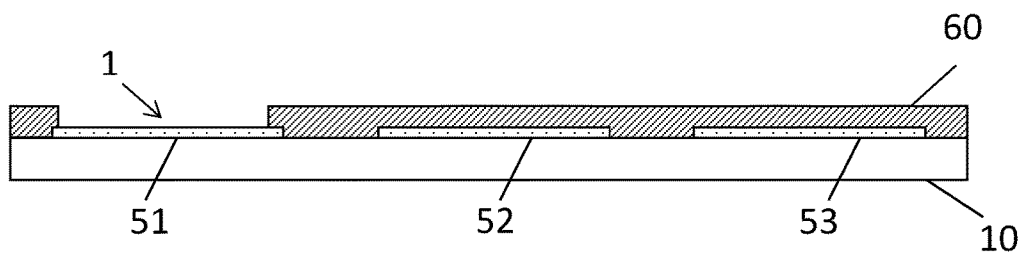
FIG. 21 schematically illustrates an example of a process step of a method for fabricating a three-color OLED, according to example embodiments.

The example method according to embodiments comprises patterning the initial shielding layer 60, thereby removing the initial shielding layer at the first location. As illustrated in FIG. 21, the initial shielding layer 60 is patterned, e.g.

such as to make a first opening 1 through the initial shielding layer 60, thereby exposing the first bottom electrode 51. The second bottom electrode 52 and the third bottom electrode 53 remain covered by the initial shielding layer 60. The initial shielding layer 60 may be patterned by conventional photolithography, followed by dry etching (e.g. using an $O_2$, $SF_6$ or $CF_4$ plasma) and/or wet etching. In some embodiments, a solvent-developable photoresist may be used for patterning the initial shielding layer 60. However, the present disclosure is not limited thereto and other photoresists may be used. The first opening 1 may have any suitable shape, such as for example a rectangular shape or a circular shape, embodiments not being limited thereto. The first bottom electrode 51 may be fully exposed or partially exposed, e.g. it may be almost fully exposed, meaning that only the edges of the first bottom electrode 51 remain covered by the initial shielding layer 60. After this step, the second bottom electrode 52 and the third bottom electrode 53 may remain covered by the initial shielding layer 60 (FIG. 21).

Figure 22:
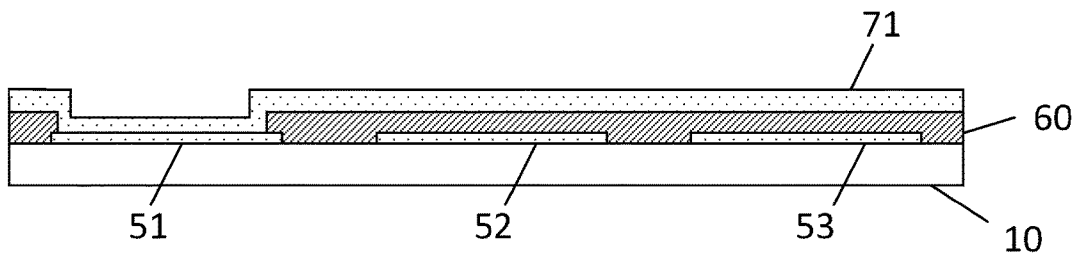
FIG. 22 schematically illustrates an example of a process step of a method for fabricating a three-color OLED, according to example embodiments.

In a next step, illustrated in FIG. 22, a first organic device layer 71 is deposited, e.g. over substantially the entire substrate, e.g. at least where the initial shielding layer 60 has been removed at the first location. In this way, the first organic device layer 71 may be brought into contact with the first bottom electrode 51. In the example described here, the first device layer 71 may correspond to a first color (first sub-pixel), e.g. the first device layer may comprise an organic semiconductor material suitable for emitting light of a first color, e.g. emitting light having a first color spectrum.

In some embodiments, e.g. in the example described here relating to a three-color OLED, the first device layer 71 may for example be a layer stack, e.g. comprising a hole injection layer, an electron blocking layer, a hole transport layer and an electroluminescent organic layer, the present disclosure not being limited thereto. The first device layer 71 may comprise at least a first electroluminescent organic layer. The first device layer 71 may be deposited by solution processing (e.g. spin-coating, printing, spray-coating, slot die coating and/or blade coating), gas phase deposition (e.g. CVD or OVPD) or vacuum deposition (e.g. evaporation).

Figure 23:
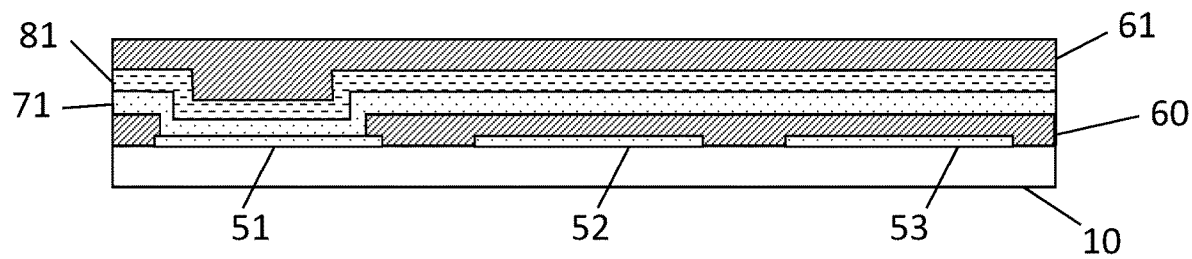
FIG. 23 schematically illustrates an example of a process step of a method for fabricating a three-color OLED, according to example embodiments.

After deposition of the first device layer 71, a first hydrophobic protection layer 81 is deposited on the first device layer 71 and a first shielding layer 61 is deposited on the first hydrophobic protection layer 81, as illustrated in FIG. 23, for example by spin-coating, slot-die coating, dip-coating, printing or blade coating, the present disclosure not being limited thereto.

Figure 24:
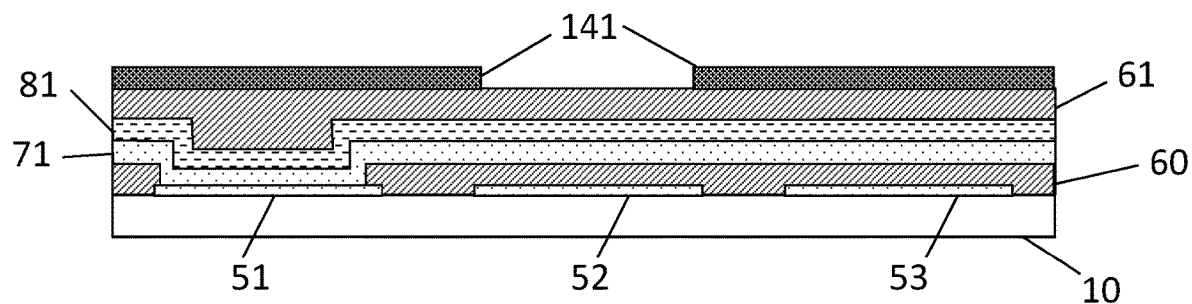
FIG. 24 schematically illustrates an example of a process step of a method for fabricating a three-color OLED, according to example embodiments.

Next, as illustrated in FIG. 24, a photoresist layer is provided on the first shielding layer 61 and patterned to thereby form a patterned photoresist layer 141. In the example shown, the patterned photoresist layer is removed at a location corresponding to the second location. A conventional photoresist may be used. In some embodiments, a solvent-developable photoresist may be used.

Figure 25:
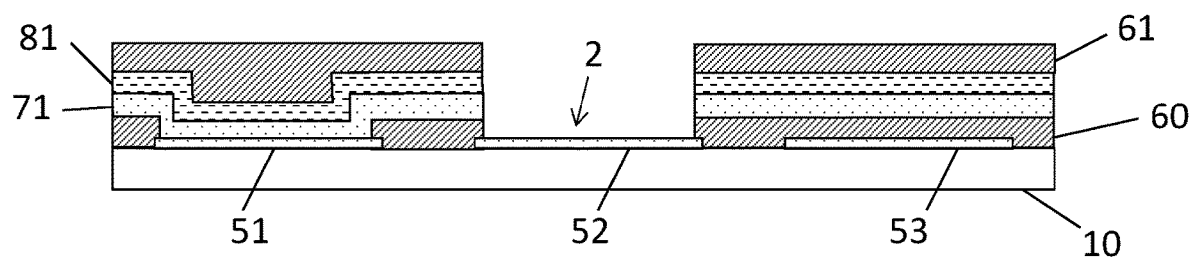
FIG. 25 schematically illustrates an example of a process step of a method for fabricating a three-color OLED, according to example embodiments.

Using the patterned photoresist layer 141 as a mask, an etching step is done, thereby locally removing the first shielding layer 61 and the underlying layers, e.g. the first hydrophobic protection layer 81, the first device layer 71 and the initial shielding layer 60. The first shielding layer 61 and the underlying layers are thereby removed at the second location, e.g. forming a second opening 2 through these layers only at the location of the second bottom electrode 52, thereby exposing the second bottom electrode 52. This is schematically illustrated in FIG. 25. The etching step can be a wet etching step or a dry etching step (e.g. using an $O_2$, $SF_6$ or $CF_4$ plasma). A single etching agent may be used for removing the different layers, embodiments not being limited thereto.

Figure 26:
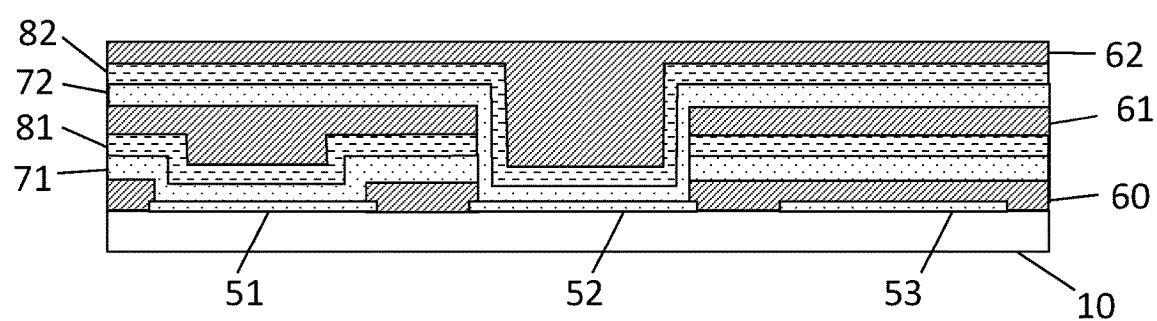
FIG. 26 schematically illustrates an example of a process step of a method for fabricating a three-color OLED, according to example embodiments.

Next a second organic device layer 72 is deposited, e.g. over substantially the entire substrate (as illustrated in FIG. 26), e.g. at least where the first shielding layer 61 and the underlying layers have been removed at the second location. In this way, the second organic device layer 72 may be brought into contact with the second bottom electrode 52. In the example described here, the second device layer or device layer stack 72 may correspond to a second color and may comprise an organic semiconductor material suitable for emitting light of the second color, e.g. for emitting light having a second color spectrum, in which the second color spectrum may be at least different from the first color spectrum over a substantial spectral range. The second organic device layer 72 may for example comprise a hole injection layer, an electron blocking layer, a hole transport layer and an electroluminescent organic layer, the present disclosure not being limited thereto. The second organic device layer 72 may comprise at least a second electroluminescent organic layer. The second device layer may be deposited by solution processing (e.g. spin-coating, printing, spray-coating, slot die coating and/or blade coating), gas phase deposition (e.g. CVD or OVPD) or vacuum deposition (e.g. evaporation).

After deposition of the second organic device layer 72, in the example shown in FIG. 26, a second hydrophobic protection layer 82 is deposited on the second organic device layer 72 and a second shielding layer 62 is deposited on the second hydrophobic protection layer 82.

Figure 27:
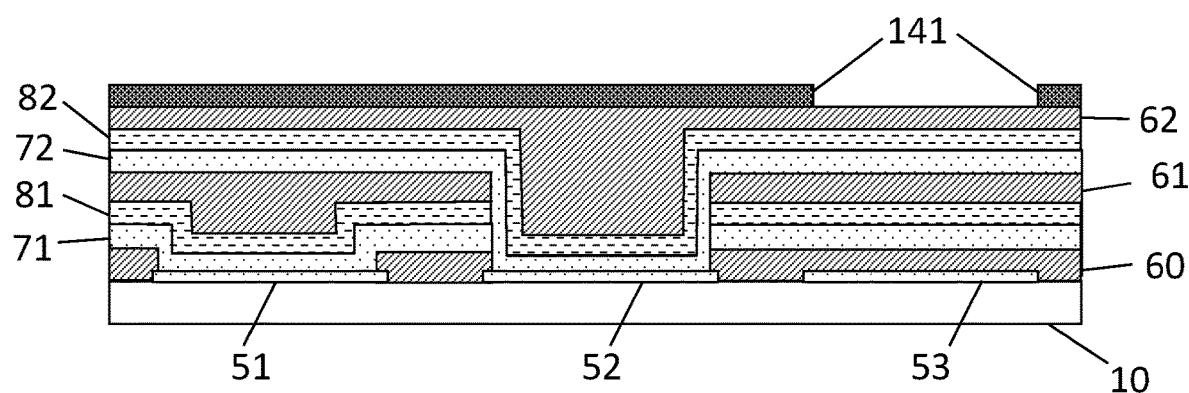
FIG. 27 schematically illustrates an example of a process step of a method for fabricating a three-color OLED, according to example embodiments.

Next, as illustrated in FIG. 27, a photoresist layer is provided on the second shielding layer 62 and patterned to thereby form a patterned photoresist layer 141. In the example shown, the patterned photoresist layer is removed at a location corresponding to the third location. A conventional photoresist may be used. In some embodiments, a solvent-developable photoresist is used.

Figure 28:
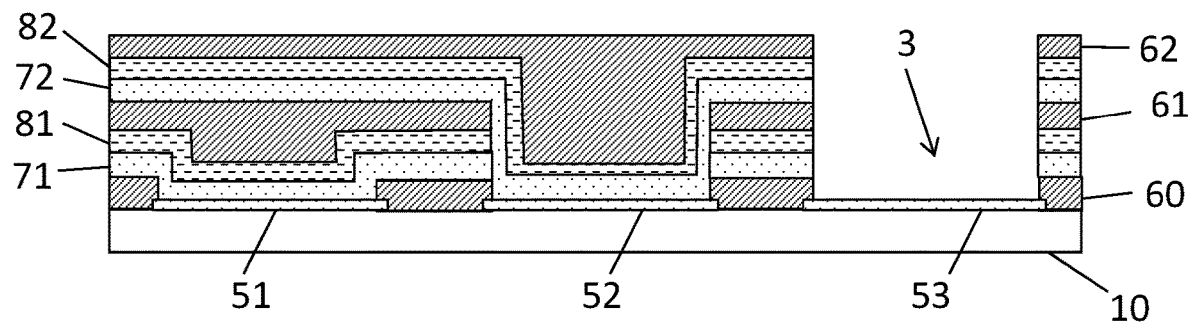
FIG. 28 schematically illustrates an example of a process step of a method for fabricating a three-color OLED, according to example embodiments.

Using the patterned photoresist layer 141 as a mask, an etching step is done, thereby locally removing the second shielding layer 62 and the underlying layers, e.g. the second hydrophobic protection layer 82, the second device layer 72, the first shielding layer 61, the first hydrophobic protection layer 81, the first device layer 71 and the initial shielding layer 60. The second shielding layer 62 and the underlying layers are thereby removed at the third location, thereby forming a third opening 3 through these layers at the location of the third bottom electrode 53, thereby exposing the third bottom electrode 53. This is schematically illustrated in FIG. 28. The etching step can be a wet etching step or a dry etching step (e.g. using an $O_2$, $SF_6$ or $CF_4$ plasma). A single etching agent may be used for removing the different layers, embodiments not being limited thereto.

Figure 29:
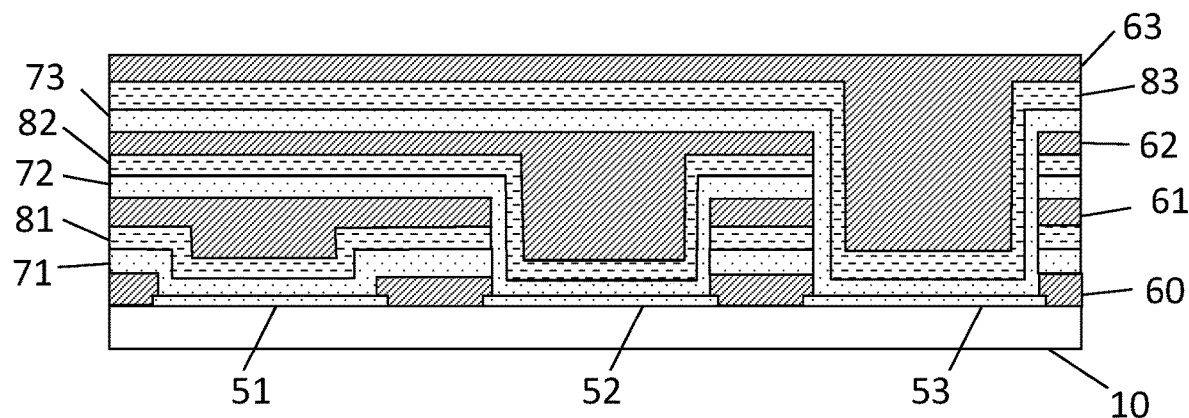
FIG. 29 schematically illustrates an example of a process step of a method for fabricating a three-color OLED, according to example embodiments.

In a next step, illustrated in FIG. 29, a third organic device layer 73 is deposited. In this way, the third device layer 73 may be brought into contact with the third bottom electrode 53. In the example described here, the third device layer 73 may correspond to a third color and may comprise an organic semiconductor material suitable for emitting light of the third color, e.g. for emitting light having a third color spectrum being different from both the first color spectrum and the second color spectrum over a respective substantial wavelength range. The third organic device layer 73 may for example be a layer stack, e.g. comprising a hole injection layer, an electron blocking layer, a hole transport layer and an electroluminescent organic layer, embodiments not being limited thereto. The third device layer 73 may comprise at least a third electroluminescent organic layer. The third device layer may be deposited by solution processing (e.g. spin-coating, printing, spray-coating, slot die coating and/or blade coating), gas phase deposition (e.g. CVD or OVPD) or vacuum deposition (e.g. evaporation).

After deposition of the third organic device layer 73, in the example shown in FIG. 29, a third hydrophobic protection layer 83 is deposited on the third organic device layer 73 and a third shielding layer 63 is deposited on the third hydrophobic protection layer 83.

Figure 30:
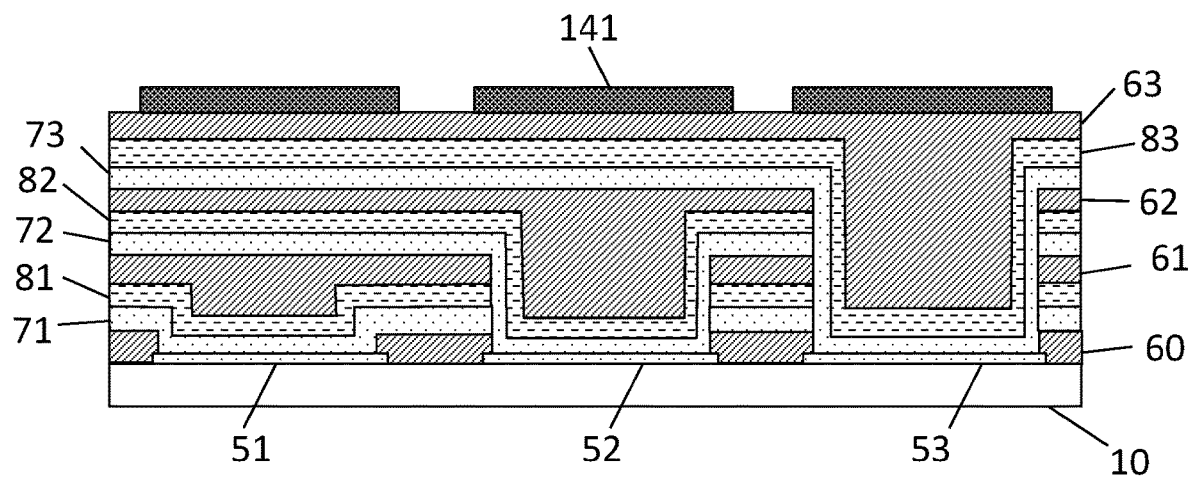
FIG. 30 schematically illustrates an example of a process step of a method for fabricating a three-color OLED, according to example embodiments.

Next the different layers may be removed at respective locations where they are not needed in the final device. To that extent, as illustrated in FIG. 30, a photoresist layer is provided on the third shielding layer 63 and patterned to thereby form a patterned photoresist layer 141. In the example shown in FIG. 30, the patterned photoresist layer 141 remains at locations corresponding to the first location, the second location and the third location. A conventional photoresist may be used. In some embodiments, a solvent-developable photoresist is used.

Figure 31:
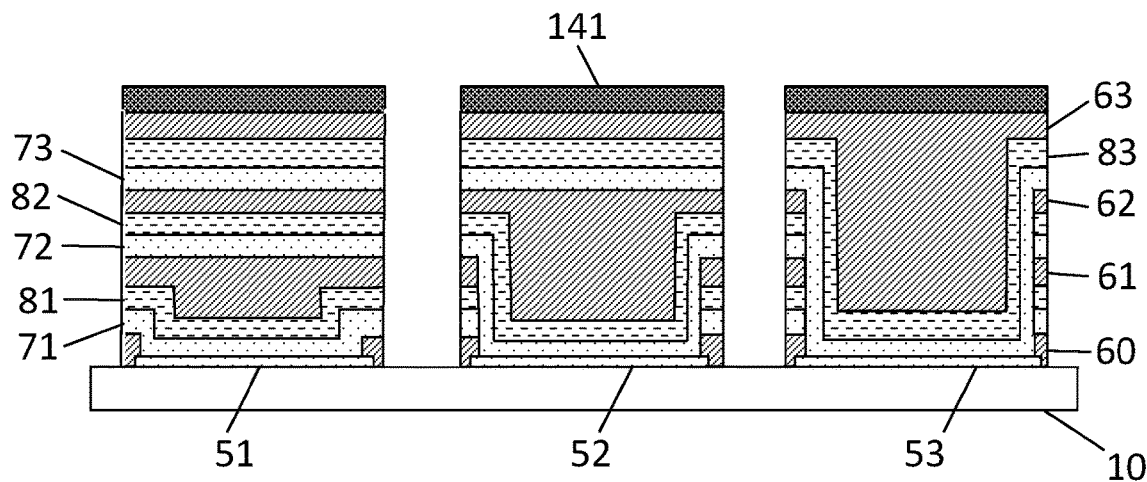
FIG. 31 schematically illustrates an example of a process step of a method for fabricating a three-color OLED, according to example embodiments.

Using the patterned photoresist layer 141 as a mask, an etching step is done, thereby locally removing the third shielding layer 63 and the underlying layers, as illustrated in FIG. 31. The third shielding layer 63 and the underlying layers are thereby locally removed at locations different from the first location, the second location and the third location. The etching step can be a wet etching step or a dry etching step (e.g. using an $O_2$, $SF_6$ or $CF_4$ plasma). A single etching agent may be used for removing the different layers, embodiments not being limited thereto.

Figure 32:
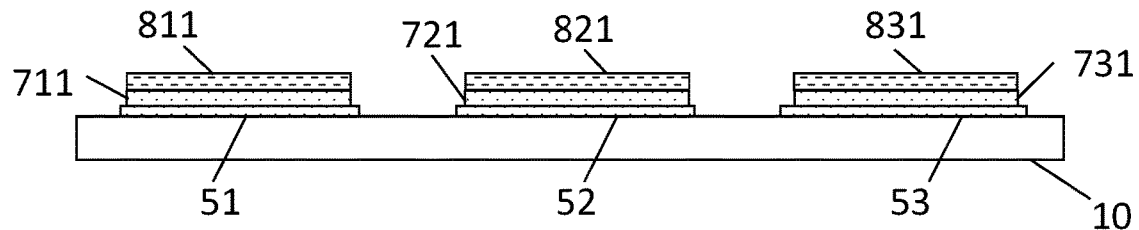
FIG. 32 schematically illustrates an example of a process step of a method for fabricating a three-color OLED, according to example embodiments.

Next the photoresist layer 141 may be removed and all superfluous layers may be removed by applying a water-based solution that dissolves the shielding layers 60, 61, 62 and 63. After treating the sample with the dissolving solution, a structure as shown in FIG. 32 is obtained, comprising side by side a first layer stack comprising a first patterned device layer 711 and a first patterned hydrophobic protection layer 811 at at least a first location, a second layer stack comprising a second patterned device layer 721 and a second patterned hydrophobic protection layer 821 at at least a second location and a third layer stack comprising a third patterned device layer 731 and a third patterned hydrophobic protection layer 831 at at least a third location on the substrate 10.

Figure 33:
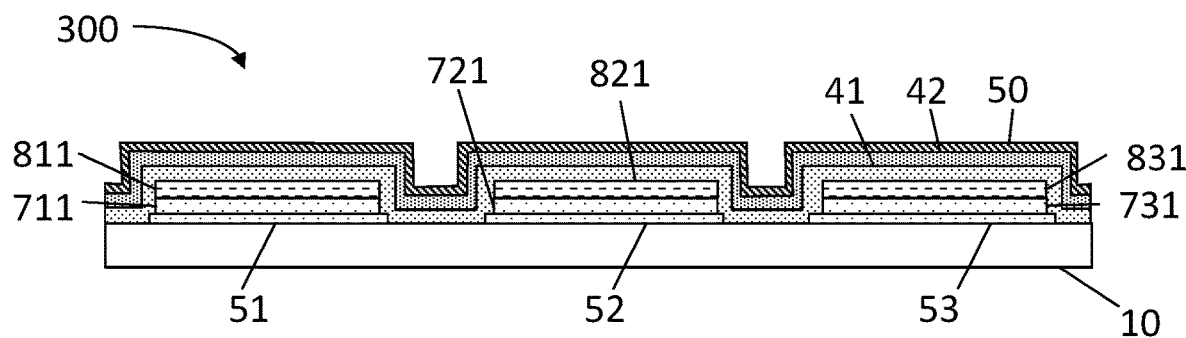
FIG. 33 schematically illustrates an example of a process step of a method for fabricating a three-color OLED, according to example embodiments.

Next, additional layers are deposited to from a three-color OLED device. For example, in embodiments wherein the first patterned device layer 711, the second patterned device layer 721 and the third patterned device layer 731 comprise a stack of e.g. a hole injection layer, a hole transport layer and an electroluminescent layer, depositing the additional layers may comprise depositing, e.g. evaporating, an electron transport layer, an electron injection layer and a cathode layer. For example, in embodiments wherein the first patterned device layer 711, the second patterned device layer 721 and the third patterned device layer 731 comprise a stack of e.g. a electron injection layer, an electron transport layer and an electroluminescent layer, depositing the additional layers may comprise depositing, e.g. evaporating, a hole transport layer, a hole injection layer and an anode layer. FIG. 33 schematically shows as an example a cross section of the resulting three-color OLED 300 after deposition of an electron transport layer 41, an electron injection layer 42 and a cathode layer 50.

The foregoing description details certain embodiments. It will be appreciated, however, that no matter how detailed the foregoing appears in text, the present invention may be practiced in many ways. It should be noted that the use of particular terminology when describing certain features or aspects should not be taken to imply that the terminology is being re-defined herein to be restricted to including any specific characteristics of the features or aspects with which that terminology is associated.

Whereas the above detailed description as well as the summary has been focused on a method for fabricating a device, the present disclosure also relates to a device comprising patterned layers obtained using a method according to any of the embodiments as described above.

While the above detailed description has shown, described, and pointed out novel features as applied to various embodiments, it will be understood that various omissions, substitutions, and changes in the form and details of the device or process illustrated may be made by those skilled in the technology without departing from the disclosure.

The invention claimed is:

1. A method for fabricating an electronic device comprising an organic layer, wherein the method comprises:
providing a patterned edge cover layer over a substrate, wherein the patterned edge cover layer comprises a first region at a first end of the substrate and a second region and a second end of the substrate, wherein each region defines a surface opposite the substrate and a sloped surface that extends from the surface towards the substrate;
providing the organic layer over the patterned edge covered layer, wherein the organic layer comprises a hole injection layer, a hole transport layer, and a light emission layer;
providing a hydrophobic protection layer having a hydrophobic upper surface over the organic layer;
providing a water-soluble shielding layer over the hydrophobic protection layer;
providing a photoresist layer directly on the water-soluble shielding layer, wherein a solvent from which the photoresist layer is formed is capable of dissolving the organic layer;
photolithographic patterning of the photoresist layer to form a patterned photoresist layer;
etching the water-soluble shielding layer, the hydrophobic protection layer and the organic layer, using the patterned photoresist layer as a mask, to form a patterned water-soluble shielding layer, a patterned hydrophobic protection layer and a patterned organic layer, and to expose at least a portion of the surface of each region of the patterned edge cover layer, lateral edges of the water-soluble shielding layer, lateral edges of the hydrophobic protection layer, and lateral edges of the hole injection layer, the hole transport layer, and the light emission layer of the organic layer;
removing the patterned water-soluble shielding layer to expose the patterned hydrophobic protection layer;
providing an electron transport layer over exposed regions of the patterned edge cover layer, the patterned hydrophobic protection layer, exposed lateral edges of the hydrophobic protection layer, and exposed lateral edges of the hole injection layer, the hole transport layer, and the light emission layer of the organic layer;

providing an electron injection layer over the electron transport layer; and providing a cathode layer over the electron injection layer.

2. The method for fabricating the electronic device according to claim 1,
wherein the organic layer comprises an active organic semiconductor layer of the electronic device, and
wherein the hydrophobic protection layer is a hydrophobic organic semiconductor charge transport layer of the electronic device.

3. The method for fabricating the electronic device according to claim 2,
wherein the active organic semiconductor layer has a first highest occupied molecular orbital (HOMO) energy level and a first lowest unoccupied molecular orbital (LUMO) energy level at a surface in contact with the hydrophobic organic semiconductor charge transport layer,
wherein the hydrophobic organic semiconductor charge transport layer has a second HOMO energy level and a second LUMO energy level at a surface in contact with the active organic semiconductor layer, and
wherein the second HOMO energy level is selected to be lower than the first HOMO energy level and the second LUMO energy level is selected to be higher than the first LUMO energy level.

4. The method for fabricating the electronic device according to claim 2,
wherein the hydrophobic organic semiconductor charge transport layer is a multilayer stack comprising a first charge transport layer in contact with the active organic semiconductor layer and a second charge transport layer at an upper side of the multilayer stack, and
wherein the second charge transport layer has a hydrophobic upper surface.

5. The method for fabricating the electronic device according to claim 4,
wherein the second charge transport layer is doped, and
wherein at least an upper portion of the first charge transport layer is doped.

6. The method for fabricating the electronic device according to claim 2,
wherein the electronic device is an organic light emitting device, and
wherein the active organic semiconductor layer is an electroluminescent layer.

7. A method for fabricating an electronic device comprising a first organic layer at a first location on a substrate and comprising a second organic layer at a second location on the substrate, the second location being non-overlapping with the first location, wherein the first organic layer and the second organic layer are patterned using a method comprising:
providing a patterned edge cover layer over the substrate, wherein the patterned edge cover layer comprises a first region at a first end of the substrate and a second region and a second end of the substrate, wherein each region defines a surface opposite the substrate and a sloped surface that extends from the surface towards a surface of the substrate;
providing an organic layer over the patterned edge covered layer, wherein the organic layer comprises a hole injection layer, a hole transport layer, and a light emission layer;
providing a hydrophobic protection layer having a hydrophobic upper surface over the organic layer;
providing a water-soluble shielding layer over the hydrophobic protection layer;
providing a photoresist layer directly on the water-soluble shielding layer, wherein a solvent from which the photoresist layer is formed is capable of dissolving the organic layer;
photolithographic patterning of the photoresist layer to form a patterned photoresist layer;
etching the water-soluble shielding layer, the hydrophobic protection layer and the organic layer, using the patterned photoresist layer as a mask, to form a patterned water-soluble shielding layer, a patterned hydrophobic protection layer and a patterned organic layer, and to expose at least a portion of the surface of each region of the patterned edge cover layer, lateral edges of the water-soluble shielding layer, lateral edges of the hydrophobic protection layer, and lateral edges of the hole injection layer, the hole transport layer, and the light emission layer of the organic layer; and
removing the patterned water-soluble shielding layer to expose the patterned hydrophobic protection layer;
providing an electron transport layer over exposed regions of the patterned edge cover layer, the patterned hydrophobic protection layer, exposed lateral edges of the hydrophobic protection layer, and exposed lateral edges of the hole injection layer, the hole transport layer, and the light emission layer of the organic layer;
providing an electron injection layer over the electron transport layer; and
providing a cathode layer over the electron injection layer.

8. The method for fabricating the electronic device according to claim 7,
wherein the electronic device is a multicolor organic light emitting device,
wherein the first organic layer comprises a first electroluminescent layer for emitting a first color spectrum, and
wherein the second organic layer comprises a second electroluminescent layer for emitting a second color spectrum.

9. The method for fabricating the electronic device according to claim 7, wherein providing the water-soluble shielding layer over the organic layer comprises providing the water-soluble shielding layer on the hydrophobic protection layer, in direct contact with the hydrophobic protection layer.

10. The method for fabricating the electronic device according to claim 7, wherein removing the patterned water-soluble shielding layer comprises exposing the patterned water-soluble shielding layer to water or to a solution comprising water.

11. The method for fabricating the electronic device according to claim 7, wherein the organic layer comprises an organic semiconductor layer.

12. The method for fabricating the electronic device according to claim 7, wherein the hydrophobic protection layer is a hydrophobic organic semiconductor layer.

13. The method for fabricating the electronic device according to claim 12, wherein the hydrophobic organic semiconductor layer is a multilayer stack comprising at least two layers, wherein an upper layer of the multilayer stack has a hydrophobic upper surface.

* * * * *